United States Patent [19]
Murata

[11] Patent Number: 5,932,688
[45] Date of Patent: Aug. 3, 1999

[54] POLYBENZIMIDAZOLE MATERIAL WITH LOW METALLIC CONCENTRATION AND A PROCESS FOR PRODUCTION THEREOF

[75] Inventor: Makoto Murata, Saitama, Japan

[73] Assignee: Hoechst Japan Limited, Tokyo, Japan

[21] Appl. No.: 08/783,008

[22] Filed: Jan. 14, 1997

[30] Foreign Application Priority Data

Feb. 7, 1996 [JP] Japan ..................................... 8-021156

[51] Int. Cl.$^6$ ........................... C08G 69/00; C08G 73/18
[52] U.S. Cl. .......................... 528/327; 528/125; 528/128; 528/171; 528/183; 528/185; 528/186; 528/188; 528/219; 528/220; 528/228; 528/229; 528/310; 528/331; 528/339.3; 528/341; 528/342; 528/352
[58] Field of Search ...................... 528/125, 128, 528/327, 171, 183, 185, 186, 188, 219, 220, 229, 228, 310, 341, 331, 339.3, 342, 352

[56] References Cited

U.S. PATENT DOCUMENTS

| | | | |
|---|---|---|---|
| 4,020,142 | 4/1977 | Davis et al. | 528/363 |
| 4,800,188 | 1/1989 | Shepherd | 525/417 |
| 4,898,917 | 2/1990 | Sansone | 528/331 |

*Primary Examiner*—P. Hampton-Hightower
*Attorney, Agent, or Firm*—Foley & Lardner

[57] ABSTRACT

An improved polybenzimidazole wherein the total concentration of metals other than alkali metal and alkaline earth metals is 10 ppm or less. The resulting polybenzimidazole is industrially useable in parts or components of apparatus for the manufacture of semiconductors and display devices.

12 Claims, No Drawings

POLYBENZIMIDAZOLE MATERIAL WITH LOW METALLIC CONCENTRATION AND A PROCESS FOR PRODUCTION THEREOF

TECHNICAL FIELD

This invention relates to a polybenzimidazole material that is suitable for use as parts in the manufacture of various industrial products, notably semiconductor and display devices. The invention also relates to a process for producing such polybenzimidazole material.

BACKGROUND ART

Polybenzimidazole is polymeric material having the highest level of heat resistance, strength and chemical stability and was used in many applications as heat-resistant fiber, shaped part, coating varnish, etc.

However, the polybenzimidazole currently available on the market has high content of metals such as iron, chromium, nickel and copper and this has significantly limited their use as parts in the manufacture of semiconductor and display devices which are greatly influenced by metallic impurities in terms of product characteristics.

The sole commercial supplier of polybenzimidazole is Hoechst Celanese, U. S. A., who is manufacturing their product by solid-state polymerization method without using polymerization solvent. The present inventor conducted intensive studies in order to locate the cause of the significant presence of metallic impurities in polybenzimidazole. As a result, the inventor found that the metallic material used in the production equipment wore out in the process of production due to high strength of polybenzimidazole and that the resulting contamination of the product polybenzimidazole with the worn material was the cause of the high metallic concentration.

Even if the polybenzimidazole material obtained as a powder by means of above-mentioned process is treated by the following procedure, it is difficult to reduce the total metallic concentration except alkaline metal and alkaline earth metal to a sufficiently low level that satisfies the requirement for use as parts in the manufacture of semiconductor and display devices which are largely influenced by metallic impurities in terms of characteristics. The procedure comprises the steps of solubilizing the polybenzimidazole powder to separate the incorporated metallic impurities, filtrating the insolubles such as a gelled polymer, and charging the filtrate (polybenzimidazole solution) into a poor solvent against the polybenzimidazole material. The conclusion reached by the inventor was that this procedure could not lower the above-defined total metallic concentration to the required level.

DISCLOSURE OF INVENTION

The inventor conducted further studies on this problem and found that when the total concentration of metals except alkali metal and alkaline earth metal in the finally obtained polybenzimidazole material was reduced to 10 ppm and below by an additional treatment, the resulting material was industrially usable as parts in the manufacture of semiconductor and display device which are sensitive to metallic impurities except alkali metal and alkaline earth metal.

Thus, the present invention provides a polybenzimidazole material represented by the following structural formula (I):

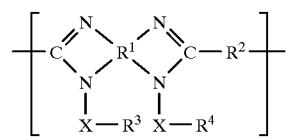

where $R^1$ in the recurring unit is a tetravalent aromatic nucleus substituted symmetrically with nitrogen atoms; $R^2$ in the recurring unit is a divalent group selected from among aliphatic, alicyclic and aromatic radicals having 2–20 carbon atoms; $R^3$ and $R^4$ in the recurring unit which may be the same or different, are each independently selected from among a hydrogen atom, an alkyl group, an aryl group and the like, which groups may be substituted with other groups; and Xs in the recurring unit are each independently selected from among a direct bond, —O—, —CO—O— and the like; or the following structural formula (II):

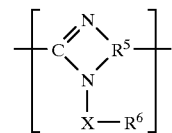

where $R^5$ in the recurring unit is an aromatic nucleus having nitrogen atoms that form a benzimidazole ring in combination with the adjacent carbon atoms of the aromatic nucleus; $R^6$ in the recurring unit is a hydrogen atom, an alkyl group, an aryl group or the like, which groups may be substituted with other groups; and X in the recurring unit is a direct bond, —O—, —CO—O—or the like, said polybenzimidazole material having a total concentration of metals except alkali metal and alkaline earth element at 10 ppm or below.

The present invention also provides a process for producing the above-described polybenzimidazole material comprising:

the step of forming a solution of a polybenzimidazole;
the subsequent step of filtrating the insoluble matters;
the subsequent step of charging the filtrate into a poor solvent against the polybenzimidazole material; and
the step of reducing the metallic concentration of the polybenzimidazole material to be finally obtained which is performed either during or after at least one of the steps mentioned above.

In each of the formulae (I) and (II), $R^3$, $R^4$ and $R^6$ are each independently a hydrogen atom, an alkyl group, an aryl group, a silicon-containing group such as a siloxane bond or the like. Preferred alkyl groups are those having 1–4 carbon atoms, as exemplified by methyl, ethyl, n- or i-propyl and t-butyl groups. Preferred aryl groups are phenyl and naphthyl groups. The alkyl group, aryl group and silicon-containing group such as a siloxane bond which are represented by $R^3$, $R^4$ and $R^6$ may be substituted with a halogen such as fluorine, an amino group, or a lower alkyl group such as methyl or ethyl. Preferred examples of $R^3$, $R^4$ and $R^6$ are a trifluoromethyl group and a hexafluoroisopropyl group.

BEST MODE FOR CARRYING OUT THE INVENTION

The present invention will now be described in detail.
A solution of polybenzimidazole must first be prepared in the invention. Having high chemical stability, polybenzimidazole is difficult to be solubilized unless a dissolution aid such as lithium chloride or calcium chloride is added. However, the addition of dissolution aid is not preferred since it only results in a further increase in the metallic concentration of the polybenzimidazole material. The present inventor developed a technique of preparing a polybenzimidazole solution without using dissolution aid; the technique uses a polar organic solvent such as N,N-dimethylacetamide, N,N-dimethylformamide or N-methyl-2-pyrrolidone that have a very low water content ($\leq 0.03$ wt%) and polybenzimidazole having very low water content by drying sufficiently is dissolved in one of these organic solvents at an elevated temperature at least 20° C., preferably at least 100° C., higher than the boiling point of the solvent used.

After removing the insolubles such as a gelled polymer by filtration under pressure using, for example, a polypropylene depth filter with a pore size of 1 micronmeter, the polybenzimidazole solution is charged into a poor solvent against the polybenzimidazole material. The poor solvent is usually selected from water or organic solvents having high affinity for the polar organic solvent such as lower alcohols and acetone in which the polybenzimidazole has been dissolved. A purpose of this charging step is to put the polybenzimidazole material back into a powder form for use in the subsequent step of making the final product. Another purpose of the charging step is to ensure that the fine metallic particles and ions in the polybenzimidazole are dissolved and dispersed into the poor solvent. In order to insure complete separation of the organic solvent, as well as the fine metallic particles and ions from the polybenzimidazole powder, it is necessary that the polybenzimidazole solution contacts the poor solvent over a sufficiently large area during the formation of the polybenzimidazole powder and, to this end, the concentration of the polybenzimidazole solution, the method of charging it into the poor solvent, the species of the poor solvent and the state of agitation are four important parameters.

Being influenced by other conditions, generally, the concentration of the polybenzimidazole solution ranges suitably from 2 to 30 wt%. If the concentration of the polybenzimidazole solution is lower than 2 wt%, only a very fine powder will result, causing operational troubles such as difficulty in isolating the powder in a subsequent step. If the concentration of the polybenzimidazole solution is higher than 30 wt%, a coarse powder will result, making it difficult to increase the area of contact between the polybenzimidazole solution and the poor solvent.

The polybenzimidazole solution is commonly charged into the poor solvent by dripping in small quantities. If desired, a lot of fine droplets of the solution may be charged at a time by means of a sprayer.

Selecting a suitable species of poor solvent is also necessary since it affects the size of the particles of the powder obtained and the aforementioned water, lower alcohol, acetone and mixture thereof can be poor solvent suitable for use in the invention. The poor solvent should be agitated in a range of 100~1000 rpm in order to increase the contact area between the polybenzimidazole solution and the poor solvent sufficiently when the polybenzimidazole solution is charged into the poor solvent.

The present inventor studied the shape of the metallic impurities in the polybenzimidazole solution and found that most of them were in the form of fine particles. Therefore, filtrating fine particles with a size of 0.1 micronmeter or more is an effective means for lowering the metallic concentration of the polybenzimidazole solution. In fact, however, due to the very small size of the metallic impurities present, the use of a filter apparatus capable of filtrating 1-$\mu$m or larger particles was hardly effective. In a preferred embodiment, filtration is performed in a multiple of stages such that the last stage consists of passage through a filter capable of removing particles of at least 0.1 micronmeter.

Using static electricity or magnetism in combination with a filter is also effective for removing the metallic impurities.

Chemical means for reducing the concentration of metals in the polybenzimidazole material include contacting the polybenzimidazole solution with a cation exchanger such as a cation-exchange resin or zeolite, separating metallic component from the polybenzimidazole with a metal chelating agent, and adding an acid such that a metallic component of interest is separated from the polybenzimidazole as a salt that is soluble in water or lower alcohol which are the poor solvent against the polybenzimidazole. Acid that can be used in the third approach include hydrochloric acid and sulfuric acid and hydrochloric acid is the most preferred for the purposes of the invention. Hydrochloric acid forms salt with many kinds of metals and most of the salts are easily soluble in water and lower alcohol which are the poor solvent against the polybenzimidazole and, hence, the salt formed in the polybenzimidazole solution can be easily removed. If the poor solvent to be used contains a strong acid, its concentration must be at least 0.1 N, preferably at least 1 N. In case of adding the strong acid into polybenzimidazole solution, sufficient quantity of the acid should be added into its solution in order to form a salt with all of the metals contained in the solution. It should, however, be noted that since the polybenzimidazole material is a strong metal chelating agent in itself, the use of ion-exchange resins or metal chelating agent is not highly effective.

The use of an acid as a chemical means for reducing the concentration of metals in the polybenzimidazole material may be realized by one of three procedures as described below. In the first approach, the filtration of insoluble matters such as a polymer gel from the polybenzimidazole solution is followed by the addition of a strong acid which, in turn, is followed by charging the polybenzimidazole solution into a poor solvent against the polybenzimidazole material. Secondly, the polybenzimidazole solution as the filtrate is charged into a poor solvent against the polybenzimidazole in the presence of a strong acid. Thirdly, the finally obtained polybenzimidazole material is washed with a suitable poor solvent in the presence of a strong acid. Whichever above-method is used, the total concentration of metals except alkali metal and alkaline earth metal in the polybenzimidazole material can positively be reduced to 10 ppm and below.

By adopting these procedures either individually or in combination, the concentration of metals in the finally obtained polybenzimidazole material can be reduced to a sufficiently low level, i.e., 10 ppm and below, and the total concentration of metals such as chromium, iron and nickel that are major components of the production equipment and which will contaminate the final product can be reduced to 5 ppm and below. In this case, the concentrations of at least two of the stated metals (Cr, Fe and Ni) are preferably each 1 ppm and below.

The polybenzimidazole material as produced in accordance with the present invention which has a total concentration of metals except alkali metal and alkaline earth metal at 10 ppm and below is shaped by a powder sintering process or injection molding for particular use as parts of the apparatus for manufacturing semiconductor and display devices which are largely influenced by the presence of small quantities of metallic impurities in terms of the characteristics of the final product. Specific examples of such components include parts of the mechanisms for transporting and fixing semiconductor wafers and substrates of thin-film transistor driven liquid-crystal display devices, as well as insulators and gaskets on vacuum chambers for use in CVD, etching and sputtering operations. If desired, the polybenzimidazole material produced in the present invention may be brought back into a solution for use as a coating varnish in applications identical to those of the shaped parts. Alternatively, the polybenzimidazole material may be cast or otherwise processed into films for use as various protective films and flexible insulated substrates in applications identical to those of the shaped parts.

For use in applications that are sensitive to alkali metal and alkaline earth metal, the polybenzimidazole material produced in the invention or the shaped parts thereof are washed with deionized water and/or deionized water containing low levels of hydrogen fluoride, thereby lowering the concentration of alkali metal and alkaline earth metal.

EXAMPLES

The present invention will now be described in detail with reference to the following examples.

Preparation of polybenzimidazole solution

Ten grams of polybenzimidazole (inherent viscosity=0.6; product of Hoechst Celanese, U. S. A.) having a recurring unit represented by the formula set forth below was dried in vacuum at 60° C. for 5 h. The dried polymer was then added to 190 g of N,N-dimethylacetamide (water content=0.03%; product of Daicel Chemical Industries, Ltd.) and the two components were held at 220° C. for 3 h under stirring at 500 rpm to form a polybenzimidazole solution at a concentration of 5 wt%. The resulting solution was passed through a polypropylene depth filter with a pore size of 1 micronmeter to remove the gelled polymer and other insoluble matters.

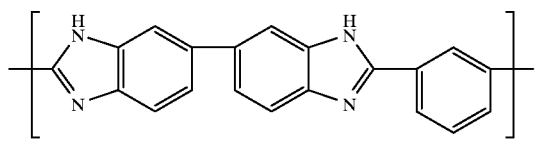

Example 1

The polybenzimidazole solution prepared as above was passed through a PTFE membrane filter with a pore size of 0.1 micronmeter and the filtrate was dripped from a dropping funnel over 30 min into 2,000 g of liquid consisting of a 1:1 mixture (by volume) of ultrapure water and methanol of a semiconductor grade having a low metal content under stirring at 300 rpm, thereby yielding a polybenzimidazole powder.

Example 2

The polybenzimidazole solution obtained in Example 1 was passed through a PTFE membrane filter with a pore size of 0.2 micronmeter and the filtrate was dripped from a dropping funnel over 30 min into 2,000 g of liquid consisting of a 1:1 mixture (by volume) of 1 N HCl made of ultrapure water and methanol of a semiconductor grade having a low metal content under stirring at 300 rpm, thereby yielding a polybenzimidazole powder.

Example 3

The polybenzimidazole powder prepared in Example 1 was washed with 1 N HCl and successively 25 wt% tetramethylammonium hydride water solution, thereby yielding a polybenzimidazole powder.

Measuring metallic impurities

The polybenzimidazole powder with none-treatment, as well as the polybenzimidazole powders obtained in Examples 1, 2 and 3 were washed with ultrapure water and dried. The dried powders were subjected to the preliminary treatment set forth in Table 1 and, thereafter, the metallic impurities in the powder were measured by ICP emission spectroscopic analysis. The results are shown in Table 2. Obviously, the starting polybenzimidazole powder contained very large amounts of metallic impurities whereas the polybenzimidazole powders obtained in Examples 1, 2 and 3 were significantly low in the concentration of the respective metals.

Table 1

Preliminary Treatment for ICP-ESA

1. Ashing
2. Melting with a fluxing agent consisting of a mixture of sodium carbonate and boric acid
3. Dissolving with water and HCl

TABLE 2

Results of Measurement of Metallic Impurities

|  | Starting powder | Example 1 | Example 2 | Example 3 |
|---|---|---|---|---|
| Cr | 1.8 | 0.49 | 0.54 | 0.51 |
| Fe | 9.0 | 2.4 | 0.94 | 1.5 |
| Ni | 1.2 | 0.4 | 0.4 | 0.4 |
| Cr + Fe + Ni | 12.0 | 3.3 | 1.88 | 2.41 |
| Total concentration of metals other than alkali metals and alkaline earth metals | 20 | 6 | 4 | 4 |

INDUSTRIAL APPLICABILITY

The polybenzimidazole material of the present invention is significantly reduced in the total concentration of metals except alkali metal and alkaline earth metal and, hence, is particularly suitable for use of parts or components in the manufacture of semiconductor and display devices which are largely influenced by metallic impurities in terms of the product characteristics.

I claim:

1. A polybenzimidazole represented by the following structural formula (I):

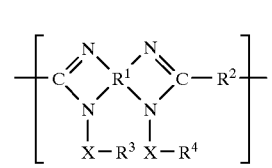

(I)

where $R^1$ is a tetravalent aromatic nucleus substituted symmetrically with nitrogen atoms; $R^2$ is a divalent group selected from the group consisting of aliphatic, alicyclic and aromatic radicals having 2–20 carbon atoms; $R^3$ and $R^4$ which may be the same or different, are each independently selected from the group consisting of a hydrogen atom, an alkyl group, and an aryl group, which groups may be unsubstituted or substituted; and X is independently selected from the group consisting of a direct bond, —O— and —CO—O—; or the following structural formula (II):

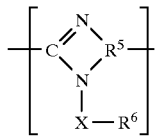
(II)

where $R^5$ is an aromatic nucleus having nitrogen atoms that form a benzimidazole ring in combination with adjacent carbon atoms of the aromatic nucleus; $R^6$ is a hydrogen atom, an alkyl group, or an aryl group, which groups may be unsubstituted or substituted; and X is a direct bond, —O—, or —CO—O—;

wherein the total concentration of metals other than alkali metal and alkaline earth metals in said polybenzimidazole is 10 ppm or less.

2. A polybenzimidazole according to claim 1, wherein the total concentration of chromium, iron and nickel is 5 ppm or less.

3. A polybenzimidazole according to claim 1, wherein the concentration of at least two of chromium, iron and nickel are each 1 ppm or less.

4. A polybenzimidazole according to claim 1, which is represented by the following structural formula:

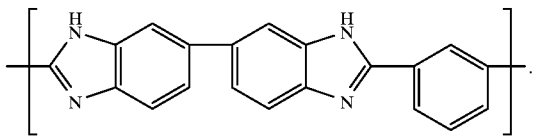

5. A process for producing a polybenzimidazole material according to claim 1 comprising:

a step of forming a solution of a polybenzimidazole to form gel insoluble matter;

a subsequent step of filtrating the gel insoluble matter;

a subsequent step of charging the filtrate produced in the filtrating step into a solvent effective to put the polybenzimidazole into a powder form; and a step of reducing the metallic concentration of the polybenzimidazole which is preformed either during or after at least one of the preceding steps.

6. A process according to claim 5, wherein said step of reducing the metallic concentration of the polybenzimidazole comprises a step of filtrating fine insoluble matter having at least 0.1 micron size after filtrating the gel insoluble matter.

7. A process according to claim 5, wherein the step of reducing the metallic concentration of the polybenzimidazole comprises adding a strong acid effective for reducing the concentration of metals in the polybenzimidazole to the polybenzimidazole solution after the step to filtrate the gel insoluble matter.

8. A process according to claim 5, wherein the step of reducing the metallic concentration in the polybenzimidazole comprises charging the polybenzimidazole solution into a solvent for the polybenzimidazole and either using said solvent in the presence of a strong acid or washing the polybenzimidazole with said solvent in the presence of a strong acid.

9. A process according to claim 5, wherein the solvent is at least one of water, a lower alcohol or acetone.

10. A process according to claim 8, wherein the solvent is at least one of water, a lower alcohol or acetone.

11. A process according to claim 7, wherein the strong acid is hydrochloric acid or sulfuric acid.

12. A process according to claim 8, wherein the strong acid is hydrochloric acid or sulfuric acid.

* * * * *